United States Patent [19]

Stormont et al.

[11] Patent Number: 4,711,695
[45] Date of Patent: Dec. 8, 1987

[54] APPARATUS FOR AND METHOD OF MAKING CRYSTALLINE BODIES

[75] Inventors: Richard W. Stormont, Warwick, R.I.; Lawrence Eriss, Sudbury, Mass.

[73] Assignee: Mobil Solar Energy Corporation, Billerica, Mass.

[21] Appl. No.: 894,294

[22] Filed: Aug. 7, 1986

Related U.S. Application Data

[62] Division of Ser. No. 495,998, May 19, 1983, Pat. No. 4,647,437.

[51] Int. Cl.⁴ .................... C30B 29/60; C30B 15/34; H01L 21/208
[52] U.S. Cl. ................... 156/608; 156/617 SP; 156/617 V; 156/DIG. 65; 156/DIG. 84; 156/DIG. 88; 164/464; 422/246
[58] Field of Search ............ 156/608, 617 SP, 617 V, 156/DIG. 65, DIG. 83, DIG. 84, DIG. 88; 422/246; 164/462, 464; 425/111, 113, 224, 404, 463, 464; 264/209.8, DIG. 47; 65/88, 89

[56] References Cited

U.S. PATENT DOCUMENTS

| | | |
|---|---|---|
| 3,015,592 | 1/1962 | Leopold ........................ 156/608 |
| 3,591,348 | 7/1971 | La Belle, Jr. .................. 156/608 |
| 3,687,633 | 8/1972 | La Belle, Jr. et al. .......... 156/608 |
| 4,036,666 | 7/1977 | Mlavsky ........................ 156/608 |
| 4,056,404 | 11/1977 | Garone et al. ................ 156/608 |
| 4,230,674 | 10/1980 | Taylor et al. ................. 422/246 |
| 4,304,623 | 12/1981 | Ciszek .......................... 156/608 |
| 4,440,728 | 4/1984 | Stormont et al. ......... 156/DIG. 98 |
| 4,517,049 | 5/1985 | Wakefield et al. ............ 422/246 |
| 4,544,528 | 10/1985 | Stormont et al. ............. 422/246 |

Primary Examiner—Gary P. Straub
Attorney, Agent, or Firm—Schiller, Pandiscio & Kusmer

[57] ABSTRACT

An improved apparatus and method is disclosed for use in a system for growing a hollow tubular body of crystalline material by growing the body from the end of a die member, whereby the hollow tubular body can be cut lengthwise along predetermined lines of the body to provide separate crystalline bodies. The apparatus comprises means (preferably in the form of notches provided in the die end of the die member from which the hollow body is grown) for concentrating stress in the hollow tubular body along the predetermined lines as the body is pulled from the die end. The method comprises the steps of (a) growing the tube from a die end of a die member so that stress is concentrated in the tube along predetermined lines as the tube is grown; and (b) cutting the tube along the predetermined lines so as to separate the hollow tube into the plurality of bodies of the crystalline material.

2 Claims, 9 Drawing Figures

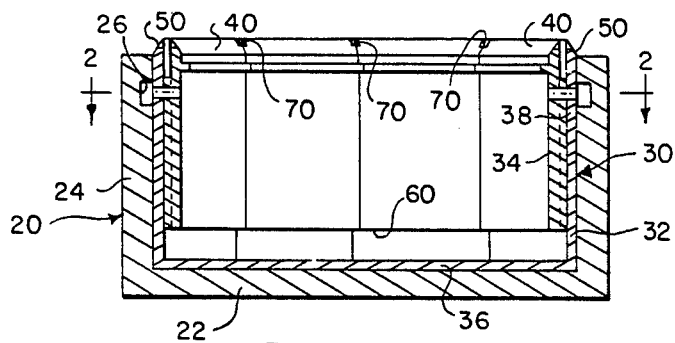
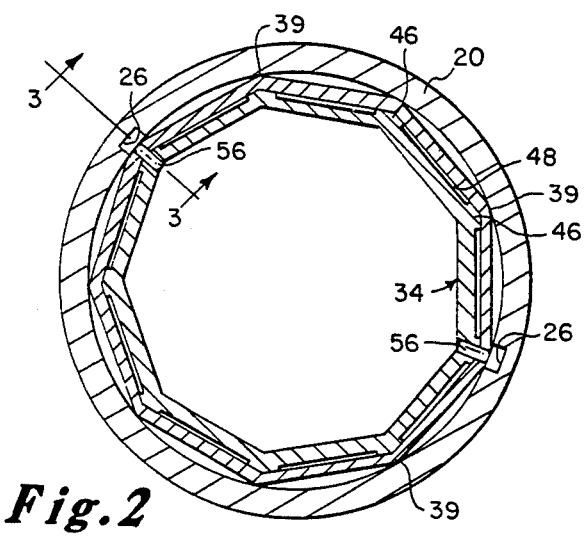
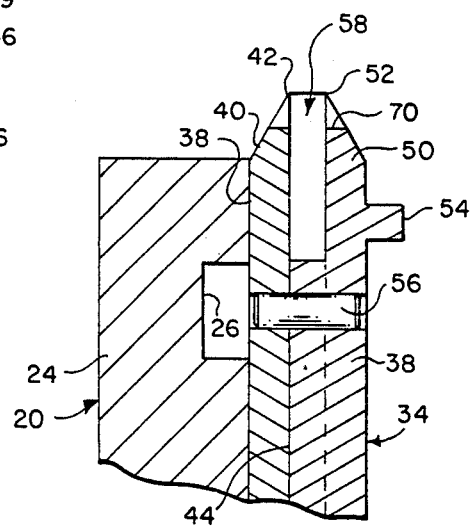
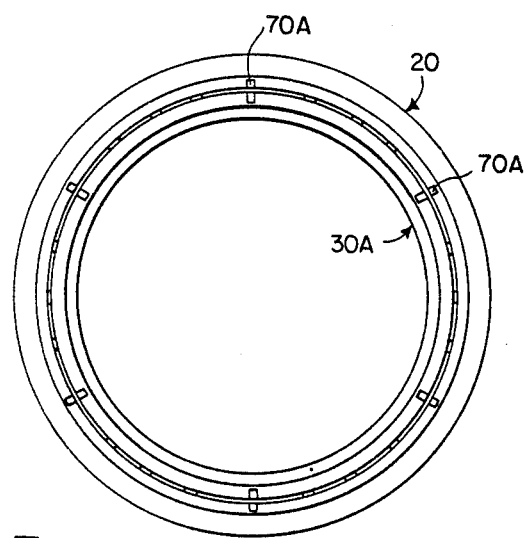
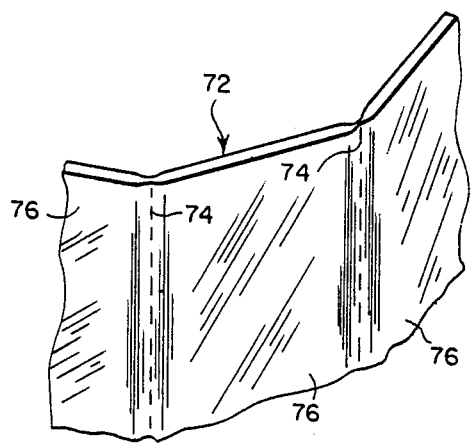

APPARATUS FOR AND METHOD OF MAKING CRYSTALLINE BODIES

This application is a divisional application of our copending application Ser. No. 495,998, filed May 19, 1983 for Apparatus for and Method of Making Crystalline Bodies, now U.S. Pat. No. 4,647,437, dated March 3, 1987.

The present invention relates generally to crystal growth and in particular, to the fabrication of bodies of crystalline materials from a liquid melt for use in forming solar cells and other solid state devices.

Various techniques are now known for growing crystalline bodies from a liquid melt. One such technique which has proven to be quite successful in growing such bodies is the edge-defined film-fed growth process, usually referred to in abbreviated form as the "EFG" Process. This process is described in U.S. Pat. No. 3,591,348, issued to Harold E. LaBelle, Jr., as well as many subsequently issued patents. By this process, it is possible to grow crystalline bodies of silicon, or other material such as alpha-alumina (sapphire), spinel, chrysoberyl, barium titanate, lithium niobate, and yttrium aluminum garnet.

Crystalline bodies have been grown in such diverse shapes as rods, hollow tubes, and flat ribbons. The hollow tubes have included various cross-sectional shapes including circular, polygonal, and oval cross-sectional shapes. See, for example, U.S. Pat. No. 3,687,633, issued to Harold E. LaBelle, Jr., for apparatus for growing rods, circular cross-sectioned tubes and ribbons, while U.S. Pat. No. 4,036,666, issued to Abraham I. Mlavsky, shows tubular bodies of oval cross-sectional shape.

In greater detail, the EFG Process utilizes a "crucible-die" assembly which typically includes a crucible member for containing the melt material at a temperature above the melting point of the material, and a capillary die member partially disposed in the crucible member. The capillary die member includes one or more passageways of capillary dimensions providing fluid communication between the melt in the crucible member and the top surface of the capillary die member. When growing crystalline material from this crucible-die assembly a seed crystal is first brought into contact with the die top to allow sufficient material to melt at the die top and into the portions of the capillary-dimensioned passageways above the melt in the crucible member. The seed crystal is then pulled up at a constant rate from the die top. As the seed crystal is pulled the liquid melt at the die top, i.e., the meniscus, between the die top and the solidified crystalline body being formed is continuously replenished by drawing the material by capillary action from the pool of melt disposed in the crucible member below the die top, through the capillary passageways of the die top member to the die top. The shape of the crystalline body grown from the die member is determined by the external or edge configuration of the top end surface of the die member, i.e., the top edge delimiting the area of the die face wetted by the melt. For example, a hollow cylindrical crystalline body may be grown by providing the top end of the die top with a hole of the same shape as the cross-section of the hollow portion of the body since the liquid meniscus film does not discriminate between outside edges and inside edges of the die top of such die members; provided however, that the hole in the die member is made large enough so that surface tension will not cause the meniscus film around the hole to fill in over the hole.

The thickness of each crystalline body grown in accordance with this process is a function of the temperature at the die top, as well as the speed at which the body is pulled from the die top. By way of example and not limitation, a typical temperature of the die top when growing silicon is about 1450° C., while a typical pulling speed is about 0.75 to 1.5 inches/minute.

Initially, solar cells were commonly fabricated in substantially flat ribbon form. Ribbons employed in solar cells must be substantially monocrystalline, uniform in size and shape and substantially free of crystal defects. One problem, however, encountered in growing substantially flat ribbon bodies is that temperature gradients present across the die top can result in uneven growth, and can produce undesirable ingrown stresses within the body as it solidifies.

U.S. Pat. No. 4,036,666, issued to Abraham I. Mlavsky, describes a relatively inexpensive technique of producing semiconductor grade ribbon of, for example, silicon, by first growing a tube of the semiconductor material with a flat oval cross-section. The tube is then sliced lengthwise to remove the curved side sections so as to provide discrete substantially flat ribbons. Preferably, the outer surface of the flat oval cross-sectioned body is first coated with a conventional photoresist material such as a polymethylmethacrylate positive resist material. Then, the portions of the resist layer covering the broad side wall sections are exposed to a narrow beam of light so that at each side wall section two straight and narrow longitudinally extending areas of the photoresist material are exposed and thereby altered to a different molecular weight polymer. The tube is then immersed in a preferential solvent or etchant, such as methyl isobutyl ketone with the result that the unexposed portions of the resist material remain intact, while the exposed areas are dissolved away to expose two narrow line portions of each of the side wall sections. A silicon etchant, such as potassium hydroxide, is then applied to the tube so as to divide the tube along its exposed areas. The photovoltaic junctions can then be formed in the resulting ribbon shaped bodies.

U.S. Pat. No. 4,095,329, issued to Kramadhati Venkata Ravi, discloses another technique of inexpensively producing semiconductor grade silicon ribbon-like bodies. A large tubular body of the semiconductor material is first grown in accordance with the EFG Process. A photovoltaic junction is formed in the tubular body and then the tubular body is etch cut into its individual sections.

A principal advantage of growing tubes and subsequently etching the tube into ribbon or ribbon-like bodies is that economies of scale are achieved by essentially growing multiple ribbons simultaneously. Further, it presumably reduces the problems of edge defects found in individual ribbons grown directly from a die member, which are believed due to the shape of the liquid/solid interface at the ribbon edges when the ribbon is being grown, or the accumulation adjacent the ribbon edges of impurities present in the melt. These edge defects are objectionable and the ribbons directly grown must be further processed to remove the defects before they can be used. However, growing the tubular body and subsequently chemically etching the body to form ribbons or ribbon-like bodies creates the problem of requiring the chemical etchant to be applied in a very controlled manner.

Lasers have also been used to cut the crystalline tubes into the ribbon and ribbon-like sections. However, internal stresses can be created in a crystalline tube while the tube is being grown. Such internal stresses can result in cracks or even breakage of the ribbon or ribbon-like sections as the sections are cut from the tube.

Accordingly, it is an object of the present invention to substantially reduce or overcome the above-noted disadvantages of the prior art.

Another object of the present invention is to provide an improved process of and apparatus for manufacturing a plurality of bodies of crystalline material from a hollow tube of such material.

And another object of the present invention is to provide an improved process of and apparatus for reducing cracks and breakage of crystalline bodies sectioned from tubes of the crystalline material.

Yet another object of the present invention is to provide an improved process of and apparatus for manufacturing hollow crystalline tubular bodies such that internal and external stresses tend to be concentrated in predetermined areas of the tube where each tubular body is cut so as to facilitate cutting the tubular body into predetermined sections.

These and other objects of the present invention are achieved by an improved apparatus of the type for use in a system for growing a hollow tubular body of crystalline material by growing the body from the end of a die member, whereby the hollow tubular body can be cut lengthwise along predetermined lines of the body to provide separate crystalline bodies. The apparatus comprises container means for containing melt of the crystalline material; and die member means including (a) a die end prescribing the closed geometrical cross-sectional shape of the hollow tubular body, (b) means for transporting the melt from the container means to the die end as the body is grown from the die end, and (c) means for concentrating ingrown stress in the hollow tubular body along the predetermined lines as said body is grown from the die end.

The improved method of the present invention is of the type which produces a plurality of bodies of a crystalline material from a hollow tube. The method comprises the steps of (a) growing the tube from a die end of a die member so that ingrown stress is concentrated in the tube along predetermined lines as the tube is grown; and (b) cutting the tube along the predetermined lines so as to separate the hollow tube into the plurality of bodies of the crystalline material.

Other objects of the invention will in part be obvious and will in part appear hereinafter. The invention accordingly comprises the processes involving the several steps and the relation and order of one or more of such steps with respect to each of the others, and the apparatus possessing the construction, combination of elements, and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawings wherein:

FIG. 1 is a side elevational view, in cross-section of one embodiment of the crucible and die assembly of the present invention, disposed in a heat susceptor;

FIG. 2 is a cross-sectional view, taken along line 2—2 of FIG. 1;

FIG. 3 is an enlarged side elevational, cross-sectional fragmentary view, taken along line 3—3 in FIG. 2;

FIG. 4 is a top plan view of another embodiment of the present invention;

FIG. 5 is an isometric fragmentary view, of a typical hollow crystalline body grown from apparatus such as shown in FIGS. 1-3;

In the various drawing FIGS., like numerals are used to designate like or similar parts.

Figure 7:
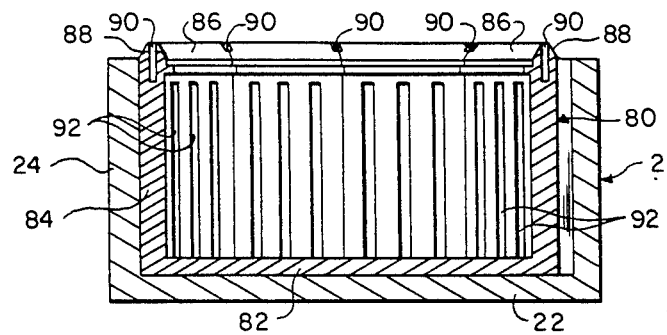
FIG. 7 is a cross-sectional elevational view taken along line 7—7 of FIG. 6.

Apparatus made in accordance with the present invention can be used in producing substantially monocrystalline bodies of a flat ribbon-shaped configuration or a curved ribbon-shaped configuration, the latter being hereafter referred to as "ribbonoids". The material or materials of which the apparatus are constructed, are largely dependent on the type of monocrystalline material grown from the die top. For example, for growing silicon the parts of the apparatus shown are preferably made of graphite, although other materials have been suggested for at least portions of the apparatus. For convenience, the following detailed description of the invention is directed to apparatus for growing substantially monocrystalline bodies of silicon, although it is not intended that the invention be so limited.

Referring to FIGS. 1-3, an assembly, incorporating the principles of the present invention, is shown for growing a hollow body of substantially monocrystalline material with predetermined "stress risers". The term "stress riser", as the term is used herein, shall mean an area in the solid crystalline material where stress is deliberately concentrated. Preferably, the predetermined stress risers provided in the hollow body grown in accordance with the present invention are distributed lengthwise along the body. The assembly shown in FIGS. 1-3 preferably, although not necessarily, includes a cylindrical heat susceptor 20, preferably made of molybdenum or graphite. Susceptor 20 is open at its top end and includes a bottom wall 22 and a cylindrical side wall 24. Cavities 26 are provided on the inner wall of side wall 24 for purposes which will be more evident hereinafter.

Disposed within susceptor 20 is a cylindrical crucible and die assembly, indicated generally at 30. As shown, crucible and die assembly 30 comprises two discrete, preferably integrally formed members 32 and 34, which for descriptive purposes shall be respectively referred to as the crucible member and the liner member. Crucible member 32 is formed as a single integrally formed cylindrical cup for containing liquid melt material and includes a bottom wall 36 and a cylindrical side wall 38. The polygonal cross-sectional shape of the crucible and die assembly 30 provides edges 39 on the outer surface of the wall 38. These edges contact the inner surface of the wall 24 of the susceptor 20 to provide a snug fit. Wall 38 includes a top section 40 circumferentially spaced around the assembly so as to prescribe the closed geometric shape identical to the external cross-sectional shape of the hollow body to be grown from the assembly 30. Top section 40 has a tapered top end or edge 42.

Crucible member 32 is preferably dimensioned to snuggly nest within the suseceptor 20 with the top edge 40 extending above and being free of the top of the susceptor 20.

The outer cylindrical surface 44 of the liner member 34 is formed with vertically oriented ribs 46 which snuggly engage the inside surface of the crucible member so as to create a fluid passageway 48 between the inside surface of the cylindrical wall 38 of crucible member 32 and the outer surface of the member 34 between each pair of adjacent ribs 46. Each passageway 48 is dimensioned within capillary proportions so that melt material can be drawn up each passageway by capillary action in a manner well-known in the art. The liner member also includes a top section 50 corresponding to and opposing the top section 40 of the crucible member 32. The top section 50 is tapered toward the top end or edge 52. A flange 54 is provided around the interior wall of the liner member for supporting a heat shield and melt cover (neither being shown) in a well-known manner.

The crucible member 32 and liner member 34 are held in concentric relation and the top sections 40 and 50 are held in opposing relation by a plurality of rivets or pins 56 which extend through suitable openings formed through the side wall 38 of crucible member 32 and through liner member 34. As shown, a cavity 26 of the susceptor 20 is adjacent each pin 56 so as to provide a clear space for the collection of melt that may leak past any of the pins 56.

The tapered or bevelled top ends 42 and 52 of opposing top sections 40 and 50 form a pair of parallel end edges which prescribe the closed geometric shape of the cross-section of the hollow body being grown and form a gap 58 of capillary dimension therebetween. The top ends 42 and 52 may be knife-edges or they may have a predetermined width. The top ends 42 and 52 may be disposed in the same plane or they may be displaced from one another. As shown in FIG. 1, with the liner member 34 secured in place, the bottom edge 60 of the liner member is positioned just above the inner surface of the bottom wall 36 of the crucible member 32 to allow for the passage of melt material therebetween. Alternatively, or additionally, one or more openings can be formed in the liner member to permit melt to flow through each passageway 48 through the capillary gap 58.

The cross-sectional shape prescribed by the die top sections 40 and 50 can be polygonal as shown in FIGS. 1-3, or circular as shown in FIG. 4, or any other closed geometric shape, such as oval. Where an assembly having a polygonal cross-section is used, such as shown in FIGS. 1-3, the individual bodies cut from the hollow body grown will be flat ribbons, while the circular cross-section of the assembly 30A of FIG. 4 provides a hollow body of circular cross-section which can be cut into ribbonoid sections.

The assembly, thus described, is identical to that described in U.S. Pat. No. 4,230,674 except that means are provided for concentrating stress at predetermined locations, preferably lengthwise along break lines of the hollow body of crystalline material where the body is to be cut to form the individual ribbons, or ribbon-like ribbonoids. The means for providing such a stress distrubution preferably includes a plurality of notches 70, provided transversely through the die top ends 42 and 52. The notches preferably, although not necessarily, are radially-directed and/or equidistantly spaced around the circumference of the die top sections 40 and 50 with respect to the geometric center of the die top. Preferably, a notch 70 is provided above each rib 46 of FIGS. 1-3 (or similar structure of FIG. 4) between adjacent passageways 48. Each notch 70 is dimenisoned to be sufficiently narrow and deep so that a sufficient amount of melt will be present in each notch to allow crystalline material to accumulate between the material being grown from the die top adjacent sections 40 and 50 each side of each notch, but the thickness of the material grown at those locations will be thinner than the thickness of the body grown from the die top ends 42 and 52 between each pair of adjacent notches.

Typical dimensions, which are believed to be satisfactory when growing silicon from a graphite assembly such as shown in FIGS. 1-4, are a die top having tapered top sections 40 and 50 each having a height of about 120 mils, a thickness of about 180 mils below the tapered ends 42 and 52, and a thickness of about three mils across the top edge of each end 42 and 52. Gap 58 is about thirty mils wide between the sections 40 and 50, and each notch 70 is up to 100 mils wide and up 50 mils deep, with each notch being 32 mils wide and 50 mils deep being satisfactory. These dimensions of the assembly can vary.

When growing crystalline bodies, melt is provided in the crucible at a temperature about 30° C. above the melting point of the crystalline material being grown. A seed of the crystalline material having a hollow closed geometric configuration identical to that prescribed by the die top sections 40 and 50 is brought into contact with die top sections 40 and 50 allowing a sufficient amount of material to melt in the gap 58 and passageways 48. The seed is then pulled away from the die top at a substantially constant speed, e.g., at about 1.0 inches per minute. Since the notches 70 are dimensioned to provide sufficient melt material between the material grown from the die tip ends adjacent each side of each notch, a hollow body 72 having a cross-sectional shape conforming to the prescribed shape of the ends 42 and 52 of die top sections 40 and 50 will be provided as illustrated in FIG. 5. However, the thickness of the body portions 74 grown from each of the notches 70 will be reduced as shown. Since the hollow body is pulled at a constant speed the thinner portions 74, each extending in a direction parallel to the direction the hollow body is pulled, will tend to be under greater stress than those sections 76 of the body 72 grown between notches 70. For this reason the notches 70 are said to provide stress risers in the body as it is grown. The stress risers along portions 74 are provided along the lines where the hollow crystalline body is subsequently cut into the individual sections. These stress risers thus facilitate the cutting of the hollow body into its ribbon or ribbonoid sections. By way of example and not limitation, a die top having a thickness of about 3 mils at each edge 42 and 52, and a gap of about 30 mils between the edges 42 and 52 will typically produce a body of about 15 mils thick. By providing the transverse notches 70 of about 32 mils wide and 50 mils deep, the thinner portions 74 in the body 72 shown in FIG. 5 and grown from each of the notches 70 will be approximately 5 mils thick at its thinnest part.

Once grown the body can be cut lengthwise along the thinner portions 74 in any known manner. For example, the body can be cut by the etching process such as described in U.S. Pat. Nos. 4,036,666 or 4,095,329, or alternatively, by such methods as using a laser, (e.g., a $CO_2$ laser) as well-known in the art. During the cutting operation since ingrown stress is concentrated in the thinner portions 72, cutting along these portions will result in a cleaner break between sections 76 with less cracking and breakage of these sections. The photovoltaic junctions can be formed in the ribbon shaped sections after they have been cut, or alternatively before they have been cut, as taught in U.S. Pat. Nos. 4,036,666 and 4,095,329. The subsequent sections 76 cut from the polygonal shaped crystalline body shown in FIG. 5 will be substantially flat ribbons. Other sections of other shapes and contours can be produced from hollow bodies of other cross-sectional shapes grown in accordance with the present invention. For example, curved ribbonoids in the shape of curved arcuate sections of a right angled cylinder, can be cut from a hollow cylindrical body grown with stress risers from a die top of the assembly 30A prescribing a circular cross-section and provided with notches 70A, such as shown in FIG. 4.

Figure 8:
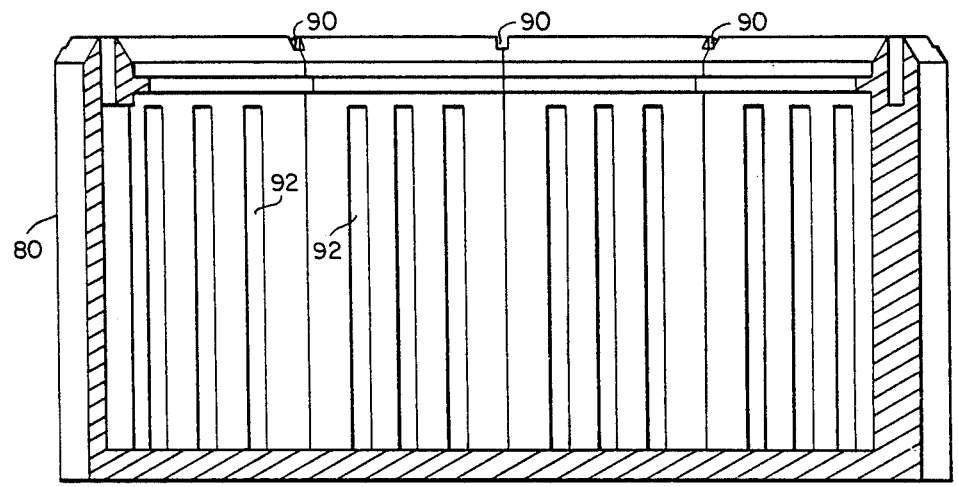
FIG. 8 is a cross-sectional elevational view taken along line 8—8 of FIG. 6 without the heat susceptor.
Figure 6:
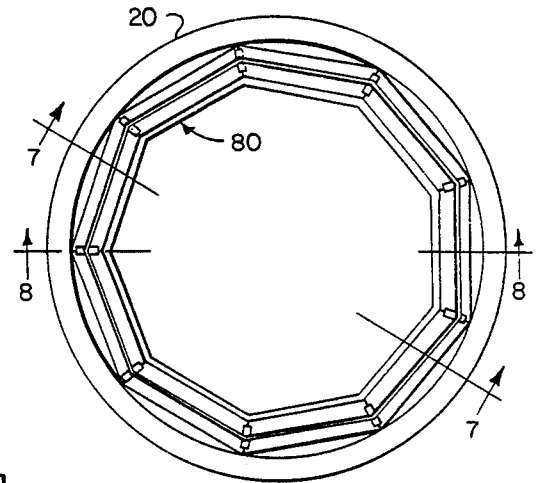
FIG. 6 is a top plan view of yet another embodiment of the crucible and die member of the present invention, disposed in a heat susceptor.

It should be appreciated that various modifications can be made to the embodiments shown in FIGS. 1-4 without departing from the scope of the invention. For example, as shown in FIGS. 6-8, the single discrete die member assembly described in U.S. Pat. No. 4,230,674 can be modified in accordance with the present invention. The modified single discrete die member 80, shown in FIGS. 6-8, is in the form of a right-angle cylinder having a flat bottom 82 and cylindrical side wall 84, integrally formed together as a single element. The member 80 also can have any closed geometric cross-sectional shape, such as the polygon shown, or a circle or oval. Side wall 84 has an outer surface dimensioned to snuggly fit within the susceptor 20, shown in FIGS. 6 and 7. The top of the member 80 is provided with inner die top section 86 and a corresponding outer die top section 88 opposing the inner die top section 86 and spaced, by the gap 90 of capillary dimension. Notches 91, circumferentially spaced around the die top, are provided transversely (preferably radially directed toward the geometric center prescribed by the die top sections 86 and 88) through the die top sections 86 and 88. Slots 92 are formed in the lower portion of the inner cylindrical surface of the member 80. These slots are also of capillary dimensions and are in fluid communication with gap 90 so that melt provided within the member 80 can be drawn by slots 92, to the gap 90 and pulled from the die top formed by the inner and outer die top sections 86 and 88. The structure is thus identical to the assembly shown in U.S. Pat. No. 4,230,674 except for the addition of the notches 90. Each of the notches 90 will result in a reduced thickness and therefore a stress riser in the wall of the hollow body grown with ingrown stress being concentrated along each of these reduced thickness areas. The hollow body grown can then be more easily cut along the lines formed by these reduced thickness areas.

Figure 9:
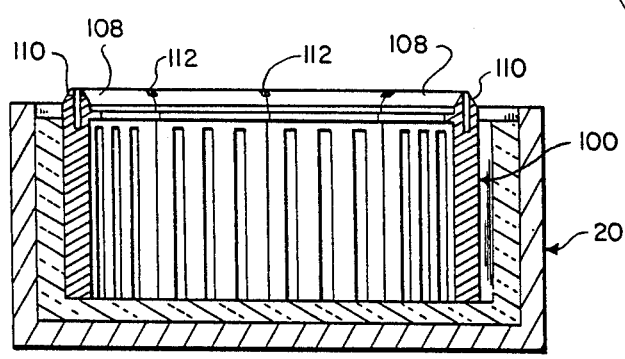
FIG. 9 is a cross-sectional view of still another embodiment of the present invention.

As shown in FIG. 9, as taught in U.S. Pat. No. 4,230,674, member 80 of in FIGS. 6-8 can be modified by omitting the bottom of the capillary die member 100, so that the cylindrical element is open at its bottom end. The member 100 is snuggly disposed within a cylindrical cup-shaped container 102, made, for example, of quartz and having a bottom 104 and side wall 106 such that the top end sections extend above and are free with respect to side wall 106. The container 102 is in turn snuggly received within susceptor 20. This embodiment can be modified to incorporate the present invention by providing the notches 112 in the inner and outer die top ends 108 and 110.

The assemblies thus shown and their use provide an improved technique of and apparatus for growing hollow bodies of a substantially monocrystalline materials from a common pool of melt. The notches formed in the die top provide a simple means for creating stress risers in predetermined areas of the hollow body being grown. These hollow bodies can be more easily cut into sections to form ribbon or ribbon-like bodies due to these stress risers formed in the hollow body during growth. This results in a greater production efficiency due to reduced cracking and breakage of the ribbon or ribbon-like sections cut from each hollow body.

Since certain changes may be made in the above process and apparatus without departing from the scope of the invention herein involved, it is intended that all matter contained in the above description or shown in the accompanying drawing shall be interpreted in an illustrative and not in a limiting sense.

What is claimed is:

1. In method of producing a plurality of bodies of a substantially monocrystalline material from a hollow tube of said crystalline material, said method including the steps comprising growing said body from a pool of said melt provided by a die end of a die member, and cutting said tube into said plurality of bodies of said crystalline material, wherein the improvement comprises:
   growing said tube from said die end of said die member so that said tube is thinner in cross section along predetermined lines than the remaining portions of said tube as said tube is being grown; and
   cutting said tube along said predetermined lines so as to separate said hollow tube into said plurality of bodies of said crystalline material.

2. A method according to claim 1, wherein said step of growing said tube includes the step of growing said predetermined lines in a direction parallel to the direction of growth of said tube.

* * * * *